US010198977B2

(12) United States Patent
Seo

(10) Patent No.: US 10,198,977 B2
(45) Date of Patent: Feb. 5, 2019

(54) DISPLAY PANEL

(71) Applicant: Samsung Display Co., Ltd., Yongin, Gyeonggi-Do (KR)

(72) Inventor: Sang Ho Seo, Cheonan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 806 days.

(21) Appl. No.: 14/807,741

(22) Filed: Jul. 23, 2015

(65) Prior Publication Data

US 2016/0267826 A1    Sep. 15, 2016

(30) Foreign Application Priority Data

Mar. 11, 2015    (KR) .................. 10-2015-0033991

(51) Int. Cl.
*G09G 3/00* (2006.01)
*H01L 27/12* (2006.01)
*G09G 3/3208* (2016.01)
*G09G 3/36* (2006.01)

(52) U.S. Cl.
CPC ........... *G09G 3/006* (2013.01); *H01L 27/124* (2013.01); *G09G 3/3208* (2013.01); *G09G 3/3614* (2013.01); *G09G 2330/12* (2013.01)

(58) Field of Classification Search
CPC ....................................................... G09G 3/006
See application file for complete search history.

(56) References Cited

U.S. PATENT DOCUMENTS

2011/0080173 A1*    4/2011   Kim ................. G09G 3/006
                                                                  324/403

FOREIGN PATENT DOCUMENTS

| KR | 10-2007-0027891 A | 3/2007 |
| KR | 10-2011-0037638 A | 4/2011 |
| KR | 10-2014-0108027 A | 9/2014 |
| KR | 10-2014-0120580 A | 10/2014 |

\* cited by examiner

*Primary Examiner* — Clayton E Laballe
*Assistant Examiner* — Jas Sanghera
(74) *Attorney, Agent, or Firm* — F. Chau & Associates, LLC

(57) ABSTRACT

A display panel is disclosed. In one aspect, the display panel includes a display unit including a plurality of pixels, an inspection circuit configured to apply a first inspection voltage to the display unit based on a first control signal, a pad portion electrically connected to the inspection circuit and configured to supply the first inspection voltage and the first control signal to the inspection circuit, and at least one external inspection line electrically connected between the inspection circuit and the pad portion. The external inspection line includes a plurality of transistors.

19 Claims, 5 Drawing Sheets

DISPLAY PANEL

CROSS-REFERENCE TO RELATED APPLICATION

This application claims priority to and the benefit of Korean Patent Application No. 10-2015-0033991 filed in the Korean Intellectual Property Office on Mar. 11, 2015, the entire contents of which are incorporated herein by reference.

BACKGROUND

Field

The described technology generally relates to a display panel.

Description of the Related Technology

It is common for display panels to be manufactured on a mother substrate and cutting the substrate into multiple display panels.

An inspection process can be performed on the mother substrate before the display panels are divided, and can be performed after the division. This inspection process can include a lighting inspection and an aging inspection.

The display panels can include at least one outside (or external) inspection line formed on an outer edge of each display panel. The outside inspection line is referred to as a module crack detection (MCD) wiring.

When a crack is generated outside the display panel, the resistance of the outside inspection line is greater than normal. Typically, a voltage drop due to the increasing of the resistance value is detected, thereby determining the presence of the crack outside the display panel.

However, as the display panel becomes larger, the outside inspection line is elongated such that the resistance value of the outside inspection line increases accordingly. To design a matching resistance for other circuit portions according to the resistance value of the outside inspection line, a minimum amount of space is required, and it is not easy to maintain this space.

In addition, even when resistance of the outside inspection line is increased due to the voltage drop amount when the crack is generated, it is difficult to detect the crack.

Accordingly, a design that prevents the voltage drop due to the wire resistance of the outside inspection line is required.

The above information disclosed in this Background section is only to enhance the understanding of the background of the invention and therefore it may contain information that does not form the prior art that is already known in this country to a person of ordinary skill in the art.

SUMMARY OF CERTAIN INVENTIVE ASPECTS

One inventive aspect relates to a display panel that can detect a crack outside the panel regardless of the length of the outside inspection line.

Another aspect is a display panel that includes a display unit arranged with a plurality of pixels; an inspection circuit unit applying a first inspection voltage to the display unit according to a first control signal; a pad portion connected to the inspection circuit unit and transmitting the first inspection voltage and the first control signal to the inspection circuit unit; and at least one outside inspection line connected between the inspection circuit unit and the pad portion, wherein the outside inspection line includes a plurality of transistors.

The outside inspection line can include a first transistor and a second transistor, the first transistor can include one end connected to a control terminal of the second transistor, with the other end of the control terminal connected to the pad portion, and the second transistor can include one end connected to the inspection circuit unit and the other end connected to the pad portion.

The outside inspection line can include N transistors, a first transistor can include one end connected to the control terminal of the second transistor and the other end of the control terminal connected to the pad portion; an M-th transistor can include one end connected to the control terminal of the (M+1)-th transistor, the other end connected to the pad portion, and the control terminal connected to one end of the (M−1)-th transistor; an N-th transistor can include one end connected to the inspection circuit unit, the other end connected to the pad portion, and the control terminal connected to one end of the (N−1)-th transistor; and M can be a natural number less than N and more than 1.

At least one transistor among the N transistors can be disposed in a first region where a wire resistance of the outside inspection line is relatively high.

The at least one transistor can have a channel that is designed to have a voltage drop amount lower than the voltage drop amount due to the wire resistance in the first region.

The display unit can include a plurality of data lines, the inspection circuit unit can be connected to the plurality of data lines and can include a plurality of inspection lines transmitting the first inspection voltage, and the outside inspection line can be a line among the plurality of inspection lines that extends outside of the display panel.

The inspection circuit unit can initialize the plurality of pixels by applying the first inspection voltage of the first level to the display unit when the first control signal is an ON-level, apply the first inspection voltage of a second level to the display unit in the next ON-level of the first control signal to emit the plurality of pixels with a predetermined gray, and it can determine that a crack is generated outside the display panel when the pixel column of the data line to which the outside inspection line is connected does not emit the predetermined gray.

When a crack is generated outside the display panel and the first control signal is the next ON-level, the pixel column can emit the gray corresponding to the voltage between the first level and the second level.

A data distribution unit transmitted with a second inspection voltage and a second control signal from the pad portion can be further included, and the data distribution unit can apply the second inspection voltage to the plurality of data lines depending on the second control signal.

The inspection circuit unit can apply the first inspection voltage to the display unit when the first control signal is the ON-level to initialize the plurality of pixels, the data distribution unit can apply the second inspection voltage to the display unit when the second control signal is the ON-level to emit the plurality of pixels with the predetermined gray, and it can determine that a crack is generated outside the display panel when the pixel column of the data line to which the outside inspection line is connected does not emit the predetermined gray.

When a crack is generated outside the display panel and the second control signal is the ON-level, the pixel column can emit the gray corresponding to the voltage between the first inspection voltage and the second inspection voltage.

Another aspect is a display panel, comprising: a display unit including a plurality of pixels; an inspection circuit configured to apply a first inspection voltage to the display unit based on a first control signal; a pad portion electrically connected to the inspection circuit and configured to supply the first inspection voltage and the first control signal to the inspection circuit; and at least one external inspection line electrically connected between the inspection circuit and the pad portion. The external inspection line includes a plurality of transistors.

In the above display panel, the transistors of the external inspection line include a first transistor and a second transistor, wherein the first transistor includes a first end electrically connected to a control terminal of the second transistor and a second end electrically connected to the pad portion, and wherein the second transistor includes a first end electrically connected to the inspection circuit and a second end electrically connected to the pad portion.

In the above display panel, the transistors of the external inspection line include N transistors, wherein an M-th transistor includes a first end electrically connected to the control terminal of an (M+1)-th transistor, a second end electrically connected to the pad portion, and a control terminal electrically connected to a first end of the (M−1)-th transistor, wherein an N-th transistor includes a first end electrically connected to the inspection circuit, a second end electrically connected to the pad portion, and a control terminal electrically connected to a first end of the (N−1)-th transistor, and wherein M and N are natural numbers, and wherein M is less than N and greater than 1.

In the above display panel, at least one of the N transistors is formed in a first region where a wire resistance of the external inspection line is greater than a predetermined resistance value.

In the above display panel, the transistor has a channel having a voltage drop amount less than a voltage drop amount due to the wire resistance in the first region.

In the above display panel, the display unit includes a plurality of data lines, wherein the inspection circuit is electrically connected to the data lines and includes a plurality of inspection lines configured to supply the first inspection voltage, and wherein the external inspection line is a selected one of a plurality of inspection lines, and wherein the external inspection line extends along an edge of the display panel.

In the above display panel, the inspection circuit is further configured to i) apply the first inspection voltage having a first level to the display unit when the first control signal has an ON-level so as to initialize the pixels and ii) apply the first inspection voltage having a second level to the display unit in the next ON-level of the first control signal such that the pixels emit light with a predetermined grayscale, wherein one of the data lines that is electrically connected to the external inspection line is electrically connected to a pixel column including a group of pixels, wherein the group of pixels in the pixel column is configured to not emit light with the predetermined grayscale when a crack exists on an edge of the display panel, and wherein the first level is less than the second level.

In the above display panel, the pixel column is further configured to emit light with a grayscale corresponding to a voltage level between the first level and the second level when the crack exists and the first control signal has the next ON-level.

The above display panel further comprises a data distribution circuit configured to receive a second inspection voltage and a second control signal from the pad portion and apply the second inspection voltage to the data lines based on the second control signal.

In the above display panel, the inspection circuit is further configured to apply the first inspection voltage to the display unit when the first control signal has the ON-level so as to initialize the pixels, wherein the data distribution circuit is further configured to apply the second inspection voltage to the display unit when the second control signal has the ON-level such that the pixels emit light with the predetermined grayscale, wherein one of the data lines that is electrically connected to the external inspection line is electrically connected is to a pixel column including a group of pixels, and wherein the group of pixels in the pixel column is configured to not emit light with the predetermined grayscale when a crack exists on an edge of the display panel, and wherein the first level is less than the second level.

In the above display panel, the pixel column is further configured to emit light with a grayscale corresponding to a voltage level between the first inspection voltage and the second inspection voltage when the crack exists and the second control signal has the ON-level.

Another aspect is a display panel, comprising: a display unit including a plurality of pixels; an inspection circuit configured to apply a first inspection voltage to the display unit; a pad portion electrically connected to the inspection circuit and configured to supply the first inspection voltage and the first control signal to the inspection circuit; and a plurality of external inspection lines electrically connected between the inspection circuit and the pad portion, wherein a first one and a second one of the external inspection lines are respectively formed on left and right sides of the display unit, wherein each of the external inspection lines includes a plurality of transistors, and wherein the external inspection lines are configured to detect a crack on an edge of the display panel.

In the above display panel, the transistors of the external inspection line include N transistors, wherein an M-th transistor includes a first end electrically connected to the control terminal of an (M+1)-th transistor, a second end electrically connected to the pad portion, and a control terminal electrically connected to a first end of the (M−1)-th transistor, wherein an N-th transistor includes a first end electrically connected to the inspection circuit, a second end electrically connected to the pad portion, and a control terminal electrically connected to a first end of the (N−1)-th transistor, and wherein M and N are natural numbers, and wherein M is less than N and greater than 1.

In the above display panel, the inspection circuit comprises a plurality of transistors each of which is connected to a column of pixels.

In the above display panel, the transistors of the first inspection line are directly connected to one of the transistors of the inspection circuit, wherein the transistors of the second inspection line are directly connected to another different one of the transistors of the inspection circuit.

In the above display panel, the display unit includes a plurality of data lines, wherein the inspection circuit is electrically connected to the data lines and includes a plurality of inspection lines configured to supply the first inspection voltage, and wherein the external inspection line is a selected one of a plurality of inspection lines, and wherein the external inspection line extends along an edge of the display panel.

The above display panel further comprises a data distribution circuit configured to receive a second inspection voltage and a second control signal from the pad portion and apply the second inspection voltage to the data lines based on the second control signal.

In the above display panel, the data distribution circuit comprises a plurality of transistors each of which is connected to a column of pixels.

In the above display panel, at least a portion of the data distribution circuit is located on one of upper and lower sides of the display unit.

In the above display panel, at least a portion of the data distribution circuit is located on the other of the upper and lower sides of the display unit.

According to at least one of the disclosed embodiments, the display panel can detect a crack outside the panel regardless of the length of the outside inspection line.

DETAILED DESCRIPTION OF CERTAIN INVENTIVE EMBODIMENTS

Figure 1:
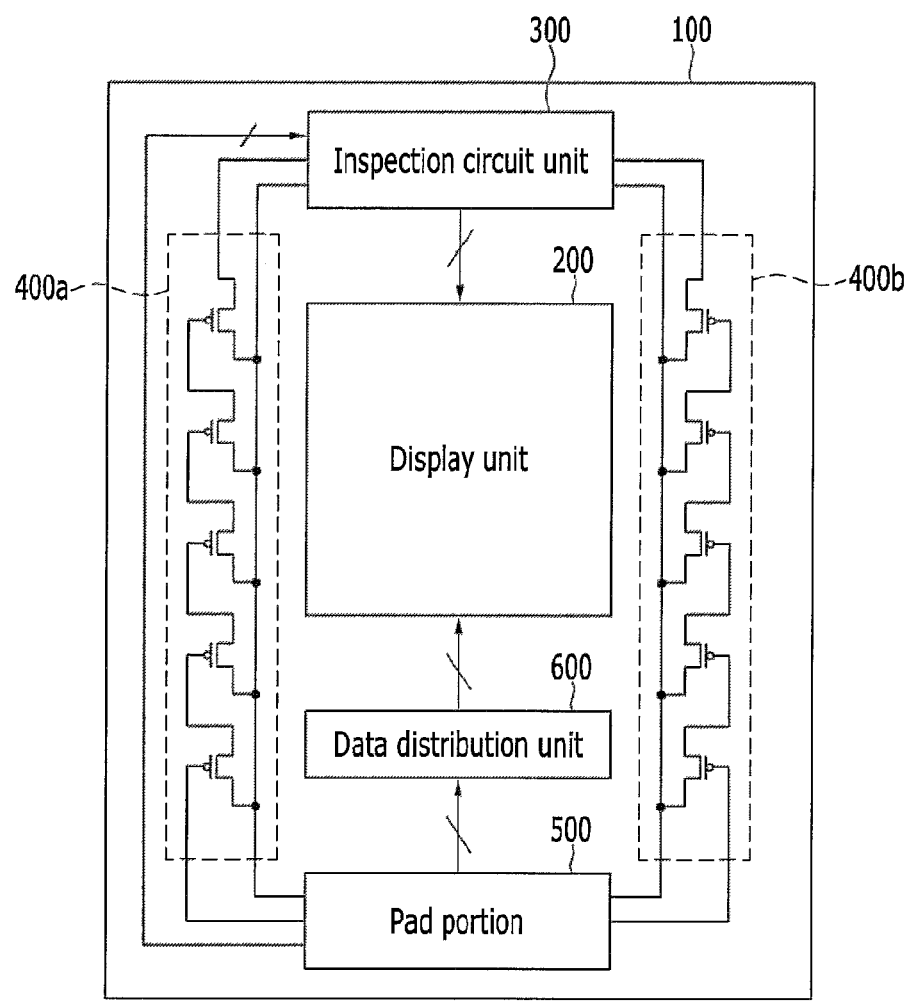
FIG. 1 is a view of a display panel according to an exemplary embodiment.

The described technology will be described more fully hereinafter with reference to the accompanying drawings, in which exemplary embodiments of the described technology are shown. As those skilled in the art would realize, the described embodiments can be modified in various different ways, all without departing from the spirit or scope of the described technology.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements can also be present. In contrast, when an element is referred to as being "directly on" another element, there are no intervening elements present. In this disclosure, the term "substantially" includes the meanings of completely, almost completely or to any significant degree under some applications and in accordance with those skilled in the art. The term "connected" can include an electrical connection.

FIG. 1 is a view of a display panel according to an exemplary embodiment.

Referring to FIG. 1, a display panel 100 includes a display unit 200, an inspection circuit unit (or inspection circuit) 300, an outside (or external) inspection line 400a and 400b, a pad portion 500, and a data distribution unit (or data distribution circuit) 600.

The display unit 200 is configured by arranging a plurality of pixels. In general, the pixels are arranged in a matrix shape. The arrangement structure can be classified into a RGB stripe, a RGBW, and a pentile structure.

Each pixel of the display unit 200 can include a liquid crystal layer for a liquid crystal display (LCD), or an organic light-emitting diode (OLED) for an OLED display.

The inspection circuit unit 300 applies a first inspection voltage to the display unit 200 depending on a first control signal. The first control signal and the first inspection voltage are transmitted from the pad portion 500.

The pad portion 500 has a function of transmitting a power source and a control signal that are applied outside to each element of the display panel 100. Accordingly, transmitting the power source and the control signal for the driving of the described technology from the pad portion 500 will be described.

The data distribution unit 600 applies the second inspection voltage to the data lines according to the second control signal. The data line is included in the display unit 200, and transmits the second inspection voltage to each pixel column connected to each data line.

The data distribution unit 600 can include a demultiplexer. The data distribution unit 600 functions by selectively applying the data voltage to the data line according to the control signal in the driving step of the display device that is not an inspection step.

The outside inspection lines 400a and 400b are formed to share the outside of the display panel 100.

The display panel 100 includes at least one outside inspection line. In the exemplary embodiment of FIG. 1, two outside inspection lines 400a and 400b are included. The outside inspection line 400a is used to detect the existence of cracks on the left portion of the outside of the display panel 100. The outside inspection line 400b is used to detect the existence of cracks on the right portion of the outside of the display panel 100.

The outside inspection lines 400a and 400b are connected between the inspection circuit unit 300 and the pad portion 500. The outside inspection lines 400a and 400b include a plurality of transistors.

The inspection circuit unit 300 and the outside inspection line 400a and 400b can be removed from the display panel 100 after the inspection is complete. When the display device is driven without the removal, the transistors included in the inspection circuit unit 300 and the outside inspection line 400a and 400b are applied with an OFF-level, thereby being insulated from other driving elements.

Figure 2:
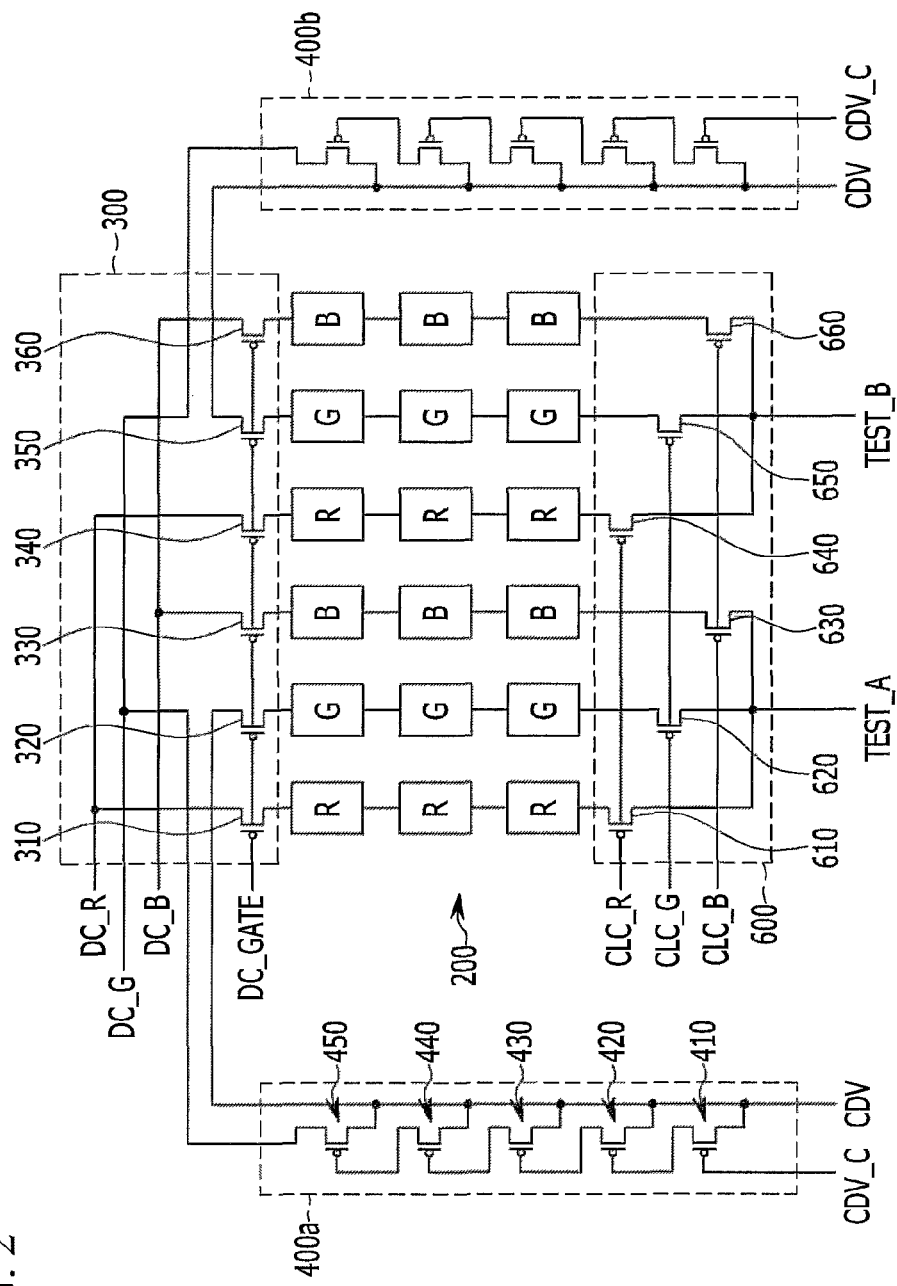
FIG. 2 is an exemplary circuit diagram of the display panel shown in FIG. 1.

FIG. 2 is an exemplary circuit diagram of the display panel shown in FIG. 1.

In the exemplary embodiment of FIG. 2, the display unit 200 includes, for example, eighteen pixels R, G, and B. The pixels R, G and B of the display unit 200 are arranged in the RGB stripe structure. The pixel (R) is a red pixel, the pixel (G) is a green pixel, and the pixel (B) is a blue pixel. The image is displayed to the user by combining the light emitted from each pixel.

The pixels in each pixel column of the display unit 200 are connected by one data line. In the exemplary embodiment of FIG. 2, each pixel column includes three pixels.

Although not shown, the pixels of one row are selected depending on a scan signal of the scan driver, such that the voltage of the data line is applied to the pixels of the corresponding row. The operation of the scan driver is known and the description for the voltage transmission from the data line to each pixel is omitted.

The inspection circuit unit 300 includes a plurality of transistors 310, 320, 330, 340, 350, and 360. The inspection circuit unit 300 receives a first control signal DC_GATE and first inspection voltages DC_R, DC_G, and DC_B from the pad portion 500.

The first control signal DC_GATE is applied to each control terminal of the transistors 310, 320, 330, 340, 350, and 360. The first inspection voltage DC_R is applied to one end of the transistor 310 and 340, the first inspection voltage DC_G is applied to one end of the transistor 320 and 350, and the first inspection voltage DC_B is applied to one end of the transistor 330 and 360.

When the first control signal DC_GATE is an ON-level, the transistors 310, 320, 330, 340, 350, and 360 are turned on such that the first inspection voltages DC_R, DC_G, and DC_B are transmitted to the display unit 200. The detailed inspection driving will be described with reference to FIGS. 3A and 3B.

In the present exemplary embodiment, all transistors are expressed as a positive typed transistor (p-type transistor), however a negative typed transistor (n-type transistor) can be applied. In the present exemplary embodiment applied with the positive typed transistor, the ON-level is a low voltage and an OFF-level is a high voltage.

The data distribution unit 600 includes a plurality of transistors 610, 620, 630, 640, 650, and 660. The data distribution unit 600 receives second control signals CLC_R, CLC_G, and CLC_B and second inspection voltages TEST_A and TEST_B from the pad portion 500.

The second control signal ClC_R is applied to the control terminal of the transistor 610 and 640. The second control signal CLC_G is applied to the control terminal of the transistor 620 and 650. The second control signal CLC_B is applied to the control terminal of the transistor 630 and 660.

The second inspection voltage TEST_A is applied to one end of the transistor 610, 620, and 630. The second inspection voltage TEST_B is applied to one end of the transistor 640, 650, and 660.

If one among the second control signal CLC_R, CLC_G, and CLC_B has the ON-level, the corresponding transistor is turned such that the second inspection voltages TEST_A and TEST_B are transmitted to the display unit 200. The detailed inspection drive will be described with reference to FIGS. 3A and 3B.

The outside inspection line 400*a* includes the transistors 410, 420, 430, 440, and 450. The outside inspection line 400*b* is the same as or similar to the structure and the function of the outside inspection line 400*a*, and thus the description thereof is omitted.

One end of the transistor 410 is connected to the control terminal of the transistor 420, and the other end of the control terminal is connected to the pad portion 500. As an exemplary embodiment, the other end of the transistor 410 is connected to a third inspection voltage CDV and the control terminal is connected to a third control signal CDV_C.

One end of the transistor 420 is connected to the control terminal of the transistor 430, the other end is connected to the third inspection voltage CDV, and the control terminal is connected to one end of the transistor 410.

The connection of the transistors 430 and 440 is similar to that described above, and thus the description is omitted.

One end of the transistor 450 is connected to the inspection circuit unit 300, the other end is connected to the pad portion 500, and the control terminal is connected to one end of the transistor 440. As an exemplary embodiment, one end of the transistor 450 is connected to the inspection line applied with the first inspection voltage DC_G, and the other end of the transistor 450 is connected to the third inspection voltage CDV.

The outside inspection line 400*a* is shaped so that one of the inspection lines extends via the outside of the display panel 100. In the present exemplary embodiment, one of the inspection lines is the inspection line applied with the first inspection voltage DC_G. The inspection line connected to the outside inspection line 400*a* can be another inspection line.

In the present exemplary embodiment, the outside inspection line 400*a* includes five transistors 410, 420, 430, 440, and 450, however it can be configured to include additional or fewer transistors.

In the present exemplary embodiment, the outside inspection line 400*b* includes five transistors, however it can be configured to include a different number than the outside inspection line 400*a*.

The transistors 410, 420, 430, 440, and 450 included in the outside inspection line 400*a* can be disposed in the first region where the wire resistance of the outside inspection line 400*a* is relatively high, or greater than a predetermined resistance value.

The resistance of the outside inspection line 400*a* can be partially changed according to the material of the outside inspection line 400*a*, the structure, and the electric relation of other elements. For example, as the outside inspection line 400*a* is elongated, the outside inspection line 400*a* has non-uniform wire resistance depending on positioning.

In the present exemplary embodiment, the transistors 410, 420, 430, 440, 450 are disposed to be positioned where the resistance of the outside inspection line 400*a* is relatively high.

The transistors 410, 420, 430, 440, and 450 can control the voltage drop amount depending on the design of the size and structure of the channel. In this case, the voltage drop amount due to the transistors 410, 420, 430, 440, 450 can be a voltage drop amount lower than the voltage drop amount due to the positioned wire resistance.

Also, in the outside inspection line 400*a*, since the voltage is supplied from the second inspection voltage DC_G and the third inspection voltage CDV, the voltage drop can be designed to be lower compared to a typical outside inspection line only including one power source supply line.

Figure 3A:
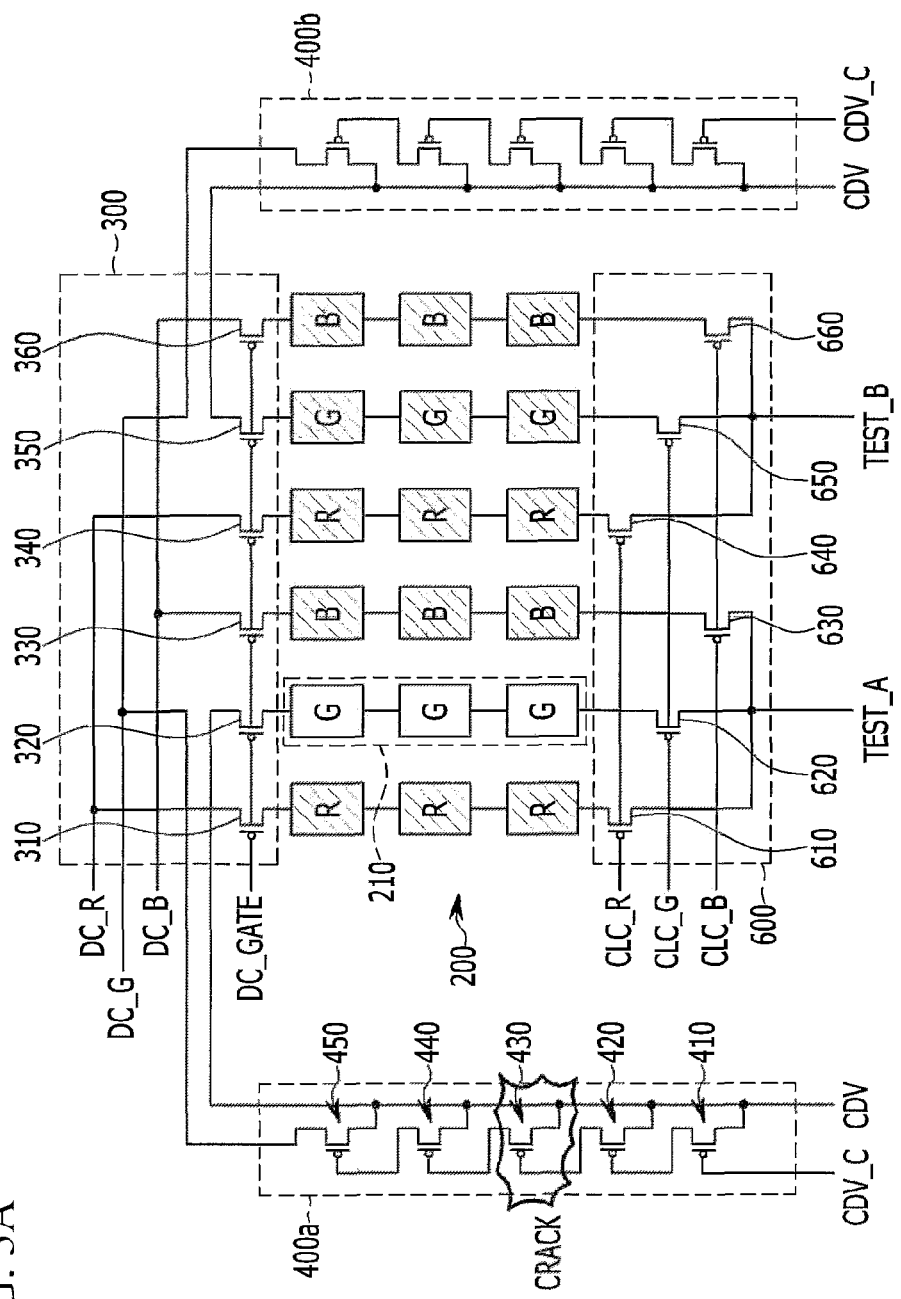
FIGS. 3A and 3B are views that explain a crack inspection driving in the circuit diagram of FIG. 2.
Figure 3B:
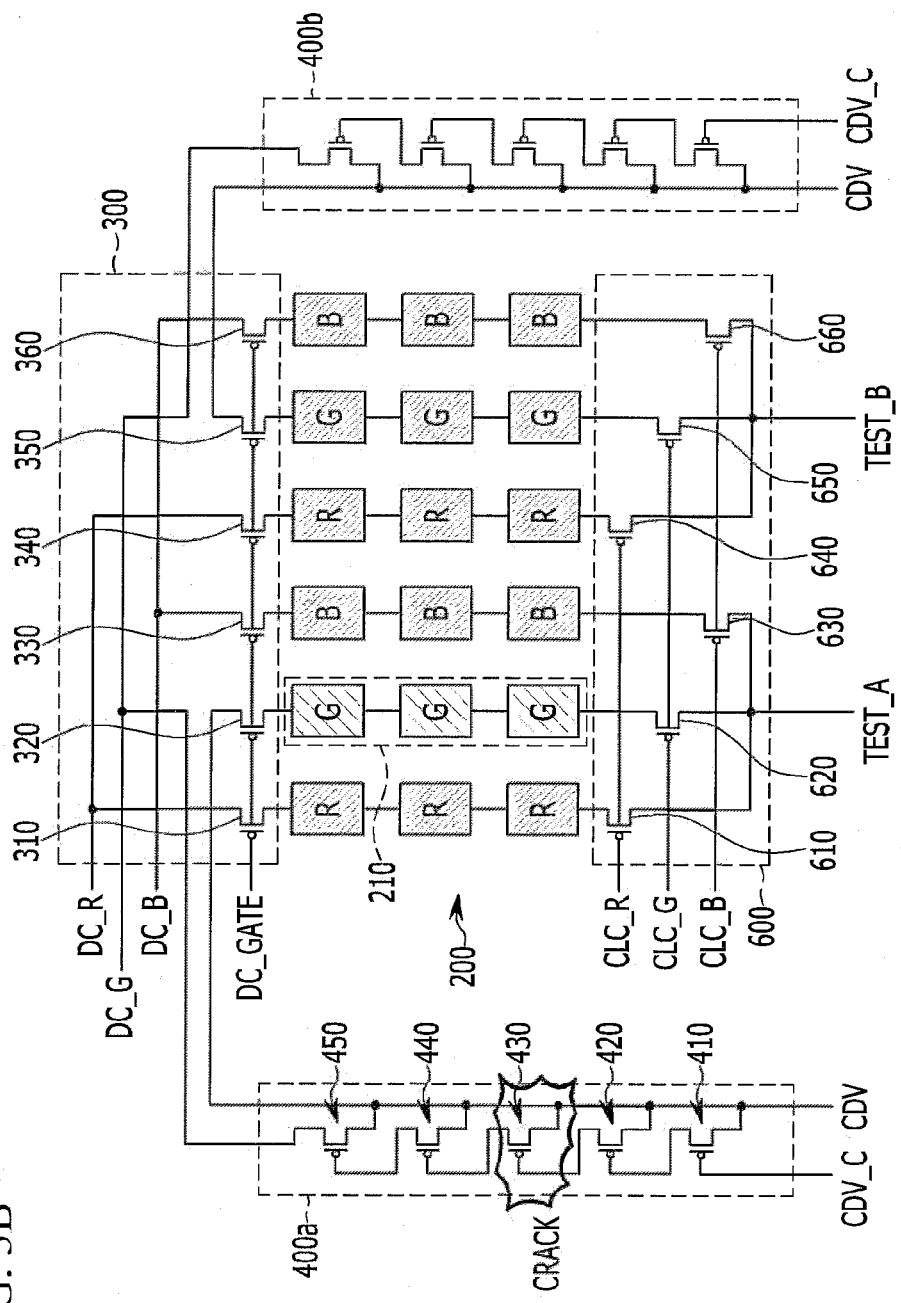

FIGS. 3A and 3B are views that explain a crack inspection driving in the circuit diagram of FIG. 2. In FIGS. 3A and 3B, it is assumed that a crack is generated in the portion where the transistor 430 of the outside inspection line 400*a* is positioned.

In the present exemplary embodiment, the display unit 200 in a white mode normally emits a white gray (or white grayscale) having the first level voltage of the low voltage and emits a black gray (or black grayscale) in a second level voltage of a high voltage.

In an exemplary embodiment, the display unit 200 in a black mode, normally emits a black grayscale having the first level voltage of the low voltage and emits a white gray grayscale having the second level voltage of the high voltage.

First, the first inspection voltages DC_R, DC_G, and DC_B are applied to the inspection circuit unit 300 through the pad portion 500. As the first control signal DC_GATE is applied with the ON-level voltage, the transistors 310, 320, 330, 340, 350, and 360 are turned on. In the present exemplary embodiment, the first inspection voltages DC_R, DC_G, and DC_B are the low level voltage, however it can be a level that is greater than the first level voltage emitting the white gray. Accordingly, the pixels R, G and B are charged with a low level voltage and can have a gray tone. It can be expressed that the pixels are initialized.

Since there is no crack in the portion where the outside inspection line 400*b* becomes the wiring, the inspection line connected to the outside inspection line 400*b* is also applied with the voltage of the same level as the other inspection line. The third inspection voltage CDV can be the same as or similar voltage as the level of the first inspection voltage DC_G. The third control signal CDV_C is applied with a low level voltage sufficient to turn on the transistor of the outside inspection line 400a and 400b.

As described above, since a crack is generated in the portion where the transistor 430 of the outside inspection line 400a is positioned, the wire resistance of the corresponding portion is relatively increased. Accordingly, since the voltage drop is generated in the first inspection voltage DC_G and the third inspection voltage CDV by the increased wire resistance, a smaller voltage than that of the other pixels is applied to the pixel column 210 connected to the transistor 320. Accordingly, the pixel column 210 is charged less than the other pixel columns.

Specifically, when the crack is generated in the wiring applied with the third inspection voltage CDV, the wire resistance is directly increased. Accordingly, the voltage drop is generated.

If the wiring to which the control terminal of the transistor 430 and one end of the transistor 420 are connected is disconnected, the third control signal CDV_C is not transmitted to the control terminal of the transistor 430. Accordingly, the transistor 430 is turned off such that the first inspection voltage DC_G is not transmitted to the corresponding pixel column 210. The pixel column 210 does not obtain the same charge level as the other pixel columns since the third inspection voltage CDV is not supplied to the pixel column 210.

As a result, although a crack is generated in any portion of the outside inspection line 400a, the voltage drop is generated such that a smaller voltage than that of the other pixel column is charged to the pixel column 210.

Accordingly, referring to FIG. 3A, the pixel column 210 emits close to the white gray tone, and the other pixel column emits the gray tone darker than the white gray.

According to the exemplary embodiment, an outside crack of the display panel 100 can be detected at this point. In this case, the configuration of the data distribution unit 600 can be excluded (referring to FIG. 4).

In another exemplary embodiment, each pixel column can be charged with the first level voltage. That is, each pixel column can have the white gray. In this case, the pixel column 210 can be charged with a lower voltage than the first level voltage. Since the display panel 100 is normally in a white mode, the pixel column 210 can also be white gray. Accordingly, differently from FIG. 3A, all the pixels can emit the white gray in the initialization point.

Next, the first control signal DC_GATE is applied with the voltage of the OFF-level such that the transistors 310, 320, 330, 340, 350, and 360 are in the OFF state.

The high level voltage is applied to the second inspection voltage TEST_A and TEST_B. In this case, the high level voltage can be a voltage capable of charging each pixel column to the second level voltage. Although not shown, the period for turning on the switching transistor of each pixel can be controlled through the scan driver. The switching transistor is controlled by the scan line, thereby having a function of supplying the voltage of the data line to each pixel. By controlling the period that the switching transistor is turned on, the charging voltage of each pixel can be charged to the second level voltage expressing the black gray.

The transistors 610, 620, 630, 640, 650, and 660 are controlled by the second control signals CLC_R, CLC_G, and CLC_B to be sequentially turned on.

Referring to FIG. 3B, the pixel columns other than the pixel column 210 are charged to the second level voltage, such that the black gray is emitted. However, since the pixel column 210 is charged less than the other pixel column in the step of FIG. 3A, the pixel column 210 is not charged enough to emit the black gray in the step of FIG. 3B.

That is, a bright line appears in the pixel column 210 among the display unit 200. Accordingly, it can be detected that a crack is generated in the left portion of the outside of the display panel 100.

Figure 4:
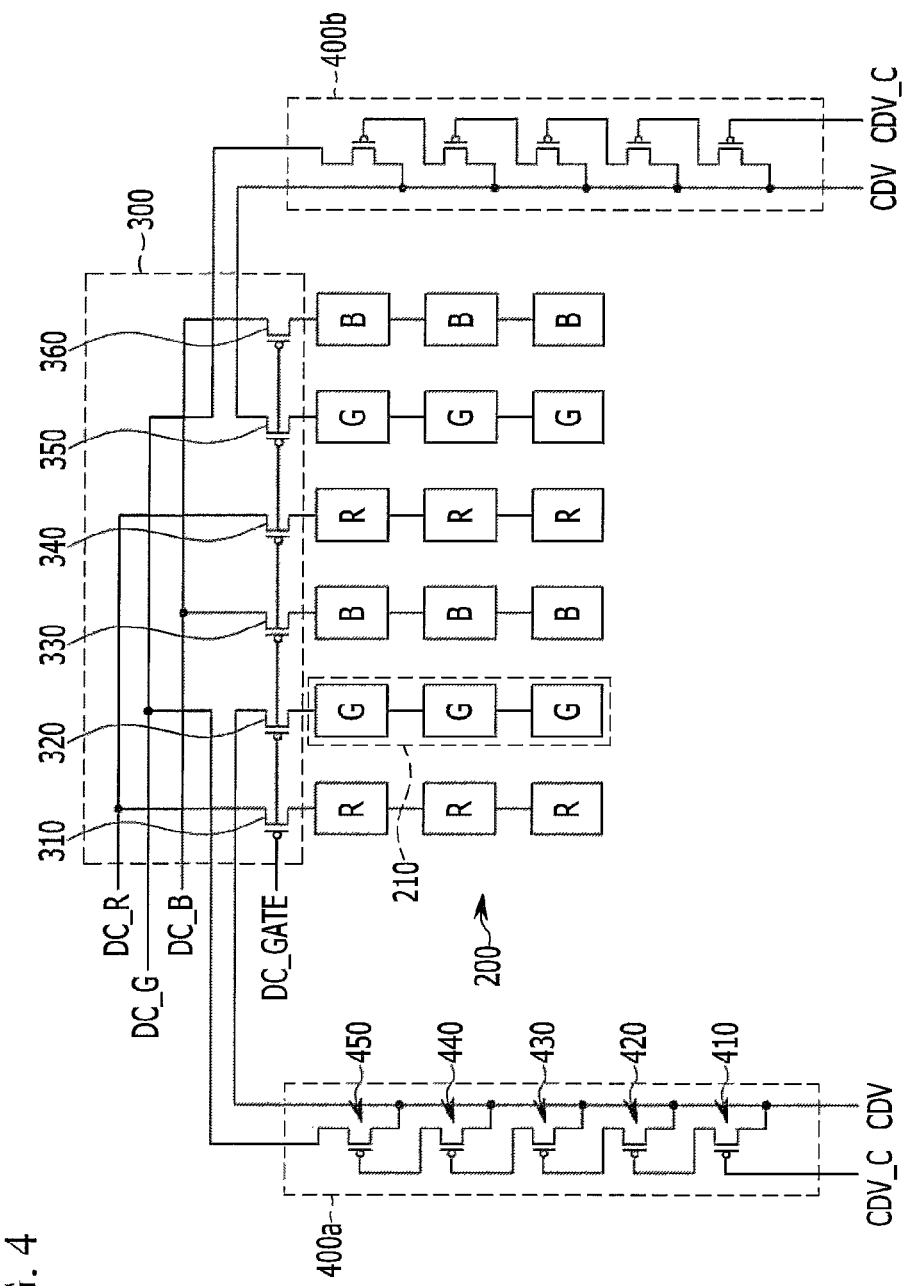
FIG. 4 is another exemplary circuit diagram of the display panel shown in FIG. 1.

FIG. 4 is another exemplary circuit diagram of the display panel shown in FIG. 1.

In FIG. 4, there is no data distribution unit 600 which is different from FIG. 2.

The method detecting an outside crack without the data distribution unit 600 is as follows.

The first inspection voltages DC_R, DC_G, and DC_B of the first level are applied to the inspection circuit unit 300 and the first control signal DC_GATE becomes the ON-level, such that the pixels R, G and B, of the display unit 200 are initialized with the first level voltage.

In this case, the pixel column 210 is not charged to the first level voltage by the voltage drop due to the crack generation.

Next, the first control signal DC_GATE becomes the OFF-level, and the first inspection voltages DC_R, DC_G, and DC_B are changed to the second level voltage.

The first control signal DC_GATE again becomes the ON-level such that the first inspection voltages DC_R, DC_G, and DC_B of the second level are supplied to the display unit 200. Accordingly, each of the pixels R, G and B is charged with the second level voltage, thereby having the black gray.

However, the pixel column 210 is not initialized with the first level voltage such that the pixel column 210 is not sufficiently charged and does not get the black gray.

Accordingly, a bright line can be detected in the pixel column 210 and it is detected that a crack on the left outside of the display panel 100 is generated.

The referenced drawings and the detailed description of the inventive technology are only examples and used merely for the purpose of describing the present invention, but are not intended to limit the meaning or the scope of the present invention stated in the claims. Accordingly, it is understood by those skilled in the art that various modifications and other equivalent exemplary embodiments are possible. Therefore, the true range of technical protection for the present invention should be determined by the technical spirit of the claims.

What is claimed is:
1. A display panel, comprising:
a display unit including a plurality of pixels;
an inspection circuit configured to apply a first inspection voltage to the display unit based on a first control signal;
a pad portion electrically connected to the inspection circuit and configured to supply the first inspection voltage and the first control signal to the inspection circuit; and
at least one external inspection line electrically connected between the inspection circuit and the pad portion,
wherein the external inspection line includes a plurality of transistors,
wherein the transistors of the external inspection line include a first transistor and a second transistor, wherein the first transistor includes a first end electrically connected to a control terminal of the second transistor and a second end electrically connected to the pad portion, and wherein the second transistor includes a first end electrically connected to the inspection circuit and a second end electrically connected to the pad portion.

2. A display panel, comprising:

a display unit including a plurality of pixels;

an inspection circuit configured to apply a first inspection voltage to the display unit based on a first control signal;

a pad portion electrically connected to the inspection circuit and configured to supply the first inspection voltage and the first control signal to the inspection circuit; and at least one external inspection line electrically connected between the inspection circuit and the pad portion, wherein the external inspection line includes a plurality of transistors, wherein the transistors of the external inspection line include N transistors, wherein an M-th transistor includes a first end electrically connected to the control terminal of an (M+1)-th transistor, a second end electrically connected to the pad portion, and a control terminal electrically connected to a first end of the (M−1)-th transistor, wherein an N-th transistor includes a first end electrically connected to the inspection circuit, a second end electrically connected to the pad portion, and a control terminal electrically connected to a first end of the (N−1)-th transistor, and wherein M and N are natural numbers, and wherein M is less than N and greater than 1.

3. The display panel of claim 2, wherein at least one of the N transistors is formed in a first region where a wire resistance of the external inspection line is greater than a predetermined resistance value.

4. The display panel of claim 3, wherein the transistor has a channel having a voltage drop amount less than a voltage drop amount due to the wire resistance in the first region.

5. The display panel of claim 2, wherein the display unit includes a plurality of data lines, wherein the inspection circuit is electrically connected to the data lines and includes a plurality of inspection lines configured to supply the first inspection voltage, and wherein the external inspection line is a selected one of a plurality of inspection lines, and wherein the external inspection line extends along an edge of the display panel.

6. The display panel of claim 5, wherein the inspection circuit is further configured to i) apply the first inspection voltage having a first level to the display unit when the first control signal has an ON-level so as to initialize the pixels and ii) apply the first inspection voltage having a second level to the display unit in the next ON-level of the first control signal such that the pixels emit light with a predetermined grayscale, wherein one of the data lines that is electrically connected to the external inspection line is electrically connected to a pixel column including a group of pixels, wherein the group of pixels in the pixel column is configured to not emit light with the predetermined grayscale when a crack exists on an edge of the display panel, and wherein the first level is less than the second level.

7. The display panel of claim 6, wherein the pixel column is further configured to emit light with a grayscale corresponding to a voltage level between the first level and the second level when the crack exists and the first control signal has the next ON-level.

8. The display panel of claim 5, further comprising a data distribution circuit configured to receive a second inspection voltage and a second control signal front the pad portion and apply the second inspection voltage to the data lines based on the second control signal.

9. The display panel of claim 8, wherein the inspection circuit is further configured to apply the first inspection voltage to the display unit when the first control signal has the ON-level so as to initialize the pixels, wherein the data distribution circuit is further configured to apply the second inspection voltage to the display unit when the second control signal has the ON-level such that the pixels emit light with the predetermined grayscale, wherein one of the data lines that is electrically connected to the external inspection line is electrically connected is to a pixel column including a group of pixels, and wherein the group of pixels in the pixel column is configured to not emit light with the predetermined grayscale when a crack exists on an edge of the display panel, and wherein the first level is less than the second level.

10. The display panel of claim 9, wherein the pixel column is further configured to emit light with a grayscale corresponding to a voltage level between the first inspection voltage and the second inspection voltage when the crack exists and the second control signal has the ON-level.

11. A display panel, comprising:

a display unit including a plurality of pixels;

an inspection circuit configured to apply a first inspection voltage to the display unit;

a pad portion electrically connected to the inspection circuit and configured to supply the first inspection voltage and a first control signal to the inspection circuit; and a plurality of external inspection lines electrically connected between the inspection circuit and the pad portion, wherein a first one and a second one of the plurality of external inspection lines are respectively formed on left and right sides of the display unit, wherein each of the plurality of external inspection lines includes a plurality of transistors, and wherein the plurality of the external inspection lines are configured to detect a crack on an edge of the display panel.

12. The display panel of claim 11, wherein each of the external inspection lines includes N transistors, wherein an M-th transistor includes a first end electrically connected to a control terminal of an (M+1)-th transistor, a second end electrically connected to the pad portion, and an (M−1)th transistor includes a first end connected to a control terminal of the M-th transistor, wherein an N-th transistor includes a first end electrically connected to the inspection circuit, a second end electrically connected to the pad portion, and a control terminal electrically connected to a first end of the (N−1)-th transistor, and wherein M and N are natural numbers, and wherein M is less than N and greater than 1.

13. The display panel of claim 12, wherein the inspection circuit comprises a plurality of transistors each of which is connected to a column of pixels.

14. The display panel of claim 13, wherein the transistors of the first external inspection line are directly connected to one of the transistors of the inspection circuit, and wherein the second external inspection line is directly connected to different transistors of the inspection circuit.

15. The display panel of claim 12, wherein the display unit includes a plurality of data lines,
   wherein the inspection circuit is electrically connected to the data lines and includes a plurality of inspection lines configured to supply the first inspection voltage, and
   at least one of the plurality of inspection lines is connected to a selected external inspection line, wherein the selected external inspection line extends along an edge of the display panel.

16. The display panel of claim 15, further comprising a data distribution circuit configured to receive a second inspection voltage and a second control signal from the pad portion and apply the second inspection voltage to the data lines based on the second control signal.

17. The display panel of claim 16, wherein the data distribution circuit comprises a plurality of transistors each of which is connected to a column of pixels.

18. The display panel of claim 17, wherein at least a portion of the data distribution circuit is located on one of upper and lower sides of the display unit.

19. The display panel of claim 18, wherein at least a portion of the data distribution circuit is located on the other of the upper and lower sides of the display unit.

* * * * *